(12) United States Patent
Ihs et al.

(10) Patent No.: US 7,409,621 B2
(45) Date of Patent: Aug. 5, 2008

(54) ON-CHIP JITTER TESTING

(75) Inventors: Hassan Ihs, Sacramento, CA (US); Salem Abdennadher, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 376 days.

(21) Appl. No.: 10/331,122

(22) Filed: Dec. 26, 2002
(Under 37 CFR 1.47)

(65) Prior Publication Data
US 2004/0128591 A1 Jul. 1, 2004

(51) Int. Cl.
*G01R 31/317* (2006.01)
*G01R 31/40* (2006.01)

(52) U.S. Cl. ......................... 714/744; 714/55

(58) Field of Classification Search ................. 714/744, 714/55, 700, 707, 731, 726, 724, 30, 34, 714/12; 326/93; 327/141; 713/400, 500
See application file for complete search history.

(56) References Cited

U.S. PATENT DOCUMENTS

| | | | |
|---|---|---|---|
| 4,164,648 A | 8/1979 | Chu | |
| 5,489,466 A * | 2/1996 | Inaba et al. | 428/212 |
| 5,590,341 A | 12/1996 | Matter | |
| 5,663,991 A * | 9/1997 | Kelkar et al. | 375/376 |
| 5,703,838 A | 12/1997 | Gorbics et al. | |
| 5,793,822 A | 8/1998 | Anderson et al. | |
| 6,295,315 B1 | 9/2001 | Frisch et al. | |
| 6,421,794 B1 * | 7/2002 | Chen et al. | 714/42 |
| 6,448,754 B1 | 9/2002 | Ihs et al. | |
| 6,657,467 B2 | 12/2003 | Seki et al. | |
| 6,670,800 B2 | 12/2003 | Beach et al. | |
| 6,747,470 B2 | 6/2004 | Muhtaroglu et al. | |
| 6,777,921 B2 | 8/2004 | Abdennadher et al. | |
| 6,836,872 B2 | 12/2004 | Abdennadher | |
| 6,822,491 B1 | 3/2005 | Fattouh et al. | |
| 6,868,534 B2 | 3/2005 | Fattouh et al. | |
| 6,934,307 B2 * | 8/2005 | DeCusatis et al. | 370/518 |
| 2002/0190283 A1 | 12/2002 | Seno | |
| 2003/0112027 A1 | 6/2003 | Muhtaroglu et al. | |
| 2003/0141859 A1 | 7/2003 | Abdennadher et al. | |
| 2003/0177427 A1 | 9/2003 | Fattouh et al. | |
| 2003/0210028 A1 | 11/2003 | Beach et al. | |
| 2004/0060017 A1 | 3/2004 | Abdennadher | |
| 2004/0085085 A1 | 5/2004 | Muhtaroglu et al. | |

OTHER PUBLICATIONS

Sunter et al., BIST for phase-locked loops in digital applications, International Test Conference, Proceedings, Sep. 28-30, 1999, pp. 532-540.*

(Continued)

*Primary Examiner*—Cynthia Britt
*Assistant Examiner*—Dipakkumar Gandhi
(74) *Attorney, Agent, or Firm*—Blakely, Sokoloff, Taylor & Zafman LLP

(57) ABSTRACT

On-chip jitter testing includes providing a clock signal to a circuit under test and delaying outputs from the circuit under test by predetermined delay values. For each delay value, a corresponding output from the circuit under test is compared with a reference signal derived from the clock signal to produce a bit error rate count for each delay value. A jitter value in the output of the circuit under test is determined based on the bit error rate counts.

6 Claims, 2 Drawing Sheets

OTHER PUBLICATIONS

Abdennadher, Salem, et al., "Mixed Signal DFT/BIST Automation Using Behavioral Modeling", 2001 Southwest Symposium on Mixed-Signal Design (SSMSD), pp. 137-140 (Feb. 25-27, 2001).

Arabi, Karim, et al., "Digital Oscillation-Test Method for Delay and Stuck-at Fault Testing of Digital Circuits", International Test Conference, pp. 91-100 (1998).

Arabi, K., et al., "Dynamic Digital Integrated Circuit Testing Using Oscillation-Test Method", Electronics Letters, vol. 34, No 8, pp. 762-764 (Apr. 16, 1998).

Abdennadher, Salem, "Flow for Phase Locked Loop Mixed Signal Simulation and Characterization Using Behavioral Modeling", 2003 Southwest Symposium on Mixed-Signal Design (SSMSD), pp. 66-70 (Feb. 23-25, 2003).

Dufaza, C., et al., "Boolean Equations for Multiple Paths Sensitisation of Digital Oscillation Built-In Self Test", Electronics Letters, vol. 34, No. 23, p. 2213-2215 (Nov. 12, 1998).

U.S. Appl. No. 11/240,687, entitled "Supply Voltage Characteristic Measurement", filed Sep. 30, 2005, by Horst W. Wagner.

Desai, Utpal, et al., "Itanium Processor Clock Design", Proceedings of the 2000 International Symposium on Phyical Design (ISPD), pp. 94-98 (May 2000).

Takamiya, Makoto, et al., "An On-chip 100GHz-Sampling Rate 8-channel Sampling Oscilloscope with Embedded Sampling Clock Generator", 2002 IEEE International Solid-State Circuits Conference (ISSCC), Digest of Technical Papers, vol. I, pp. 182-1 83 & 458 (Feb. 3, 7, 2002).

Takamiya, Makoto, et al., "An On-chip 100GHz-Sampling 8-channel Sampling Oscilloscope with Embedded Sampling Clock Generator", 2002 IEEE International Solid-State Circuits Conference (ISSCC), Digest of Technical Papers, vol. 2, pp. 140-141 & 439 (Feb. 3-7, 2002).

* cited by examiner

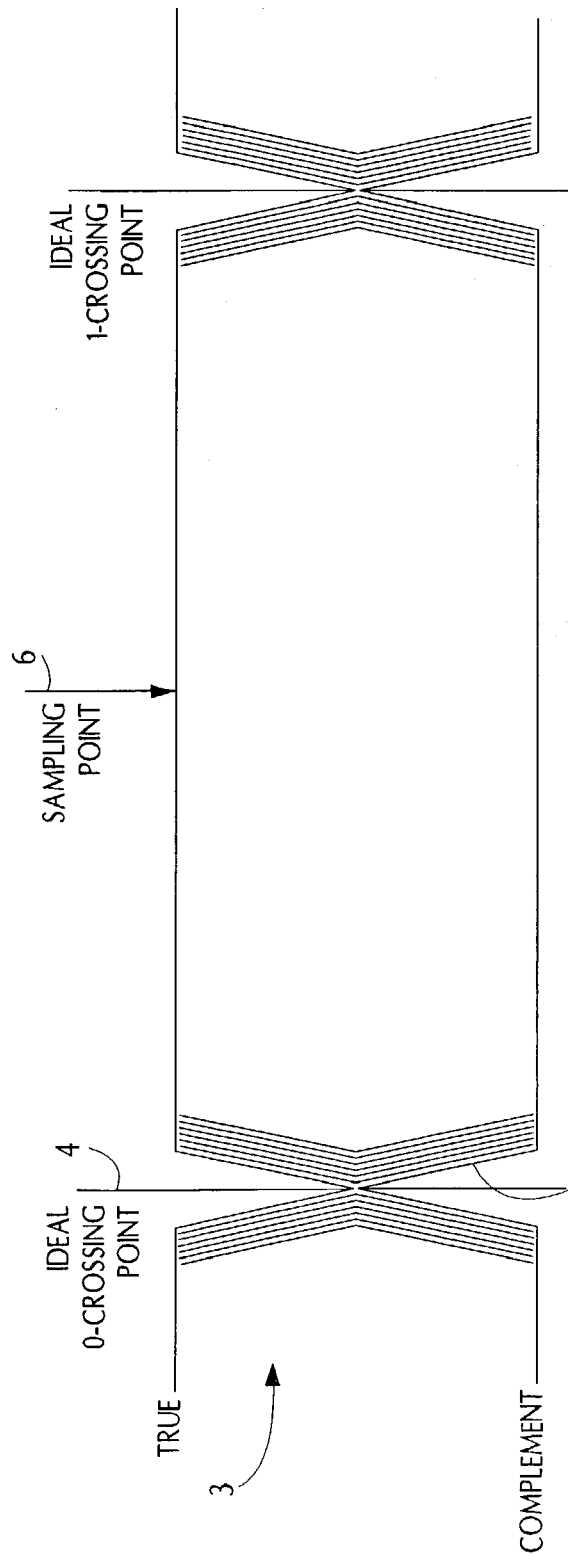
FIG. 1
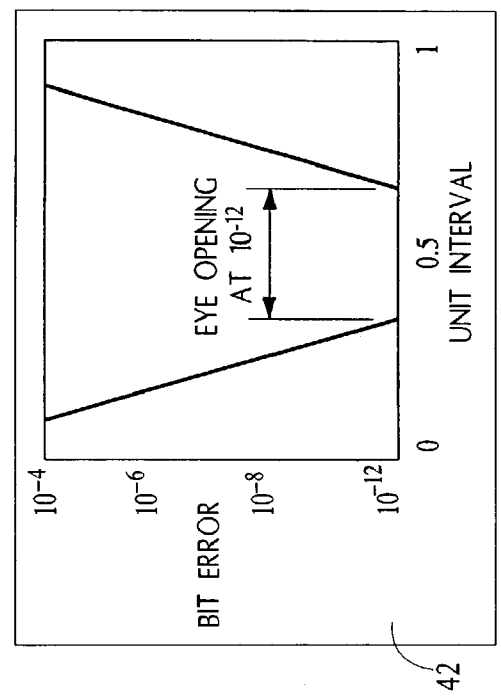
FIG. 5
| BER | TOTAL JITTER VALUE |
|---|---|
| $1.3 \times 10^{-3}$ | $6 \times \sigma$ |
| $3.17 \times 10^{-5}$ | $8 \times \sigma$ |
| $9.87 \times 10^{-9}$ | $12 \times \sigma$ |
| $1.28 \times 10^{-12}$ | $14 \times \sigma$ |
| $1 \times 10^{-12}$ | $14.069 \times \sigma$ |
FIG. 2

ON-CHIP JITTER TESTING

BACKGROUND

This disclosure relates to on-chip testing for jitter in integrated circuit ("IC") components.

Jitter is the deviation of a timing event of a signal from its ideal position. Data errors result when this deviation extends past the sampling point at the receiver. A built-in self-test ("BIST") structure is sometimes included as part of an integrated circuit to test for jitter in components of the integrated circuit. Such an on-chip testing structure allows for internal testing of integrated circuit components instead of more time-consuming external tests.

Some BIST structures for jitter are based on statistical analysis of time measurement testing. These tests calculate the jitter using standard deviation computations with embedded time to digital converters ("TDC"). High accuracy using these converters may be difficult to achieve because TDCs can be sensitive to crosstalk, substrate and power supply noise.

BRIEF DESCRIPTION OF THE DRAWINGS

FIG. 1 is an illustration of a bit cell.
FIG. 2 is an illustration of a look-up table.
FIG. 5 is a graph illustrating a Bit-Error-Rate.

DETAILED DESCRIPTION

Figure 3:
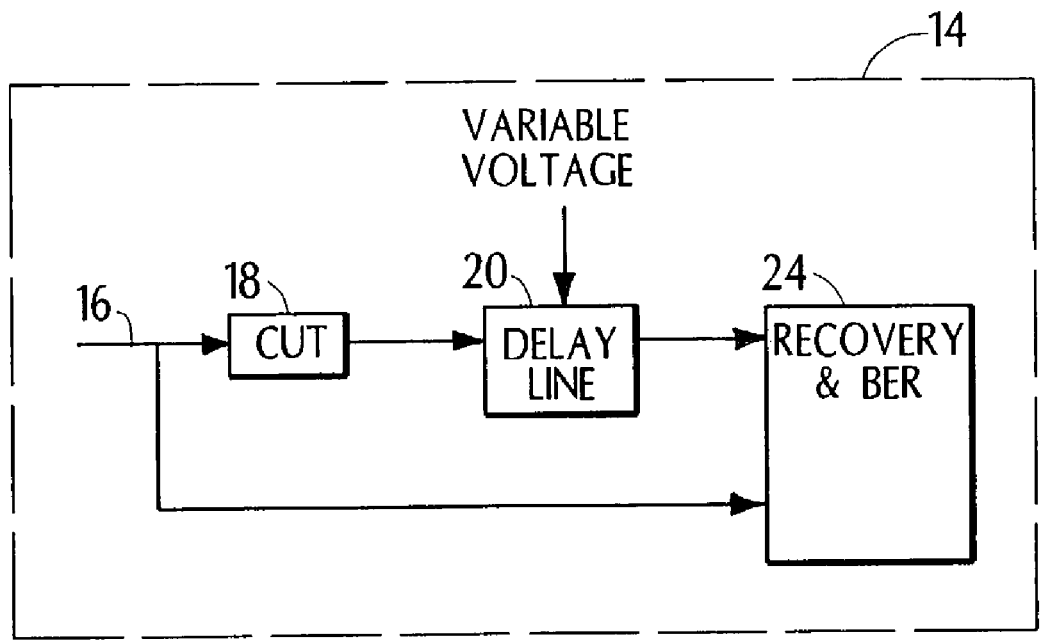
FIG. 3 is an illustration of a BIST structure for testing jitter.

FIG. 1 is an illustration of a bit cell 3 from an IC component's output. Jitter is the deviation of a timing event of the output from its ideal position 4. Data errors result when this deviation extends past the sampling point 6 at which the signal is read. If there are several short bits in a row the sample point will eventually occur on an edge 2, resulting in bit errors.

There are different types of jitter. Total jitter is the convolution of all independent jitter processes; deterministic, or systematic, jitter and random, or non-systematic, jitter. Deterministic jitter is due to non-Gaussian processes and has a bounded amplitude and a specific cause. Deterministic jitter may include jitter resulting from duty cycle distortion, data dependent jitter (e.g., inter-symbol interference-ISI), sinusoidal jitter, and un-correlated (to the data) bounded jitter. Deterministic jitter is measured as a peak-to-peak value and sums linearly.

Random jitter is characterized by a Gaussian distribution and is assumed to be unbounded. It is often measured in root-mean-square value, which equals the standard deviation ($\sigma$) in a Gaussian process.

Because random jitter can be modeled as a Gaussian distribution it can be used to predict peak-to-peak jitter as a function of a bit error rate ("BER").

FIG. 2 shows exemplary total jitter values 10 that correspond to various bit error rates 12. Conversely, the BER values 12 can be used as a measurement of total jitter 10.

FIG. 3 shows a BER based built-in self-test ("BIST") structure 14 for jitter. A clock signal 16 may be generated and provided as an input to the circuit under test ("CUT") 18. The output of the CUT 18 is subject to a delay line 20 that has predetermined delay values. For each delay value, additional circuitry 24 compares the delayed output of the CUT 18 with a reference signal derived from the clock signal 16. Based on this comparison, the recovery and bit error rate circuitry 24 produces a BER count that can be used to determine jitter values.

The delay line 20 is used to simulate jitter contribution in a system cascade in which the CUT 18 is inserted. Delaying the clock signal 16 under test edge so it becomes closer to the reference edge makes more jitter values appear as bit errors. For example, if the delay line 20 is adjusted so that the difference between the delayed CUT output and the reference signal equals a specified intrinsic jitter RMS value, the number of bit errors obtained can be interpreted as the BER that the circuit would yield in a cascade that contributes jitter near the specified value.

Figure 4:
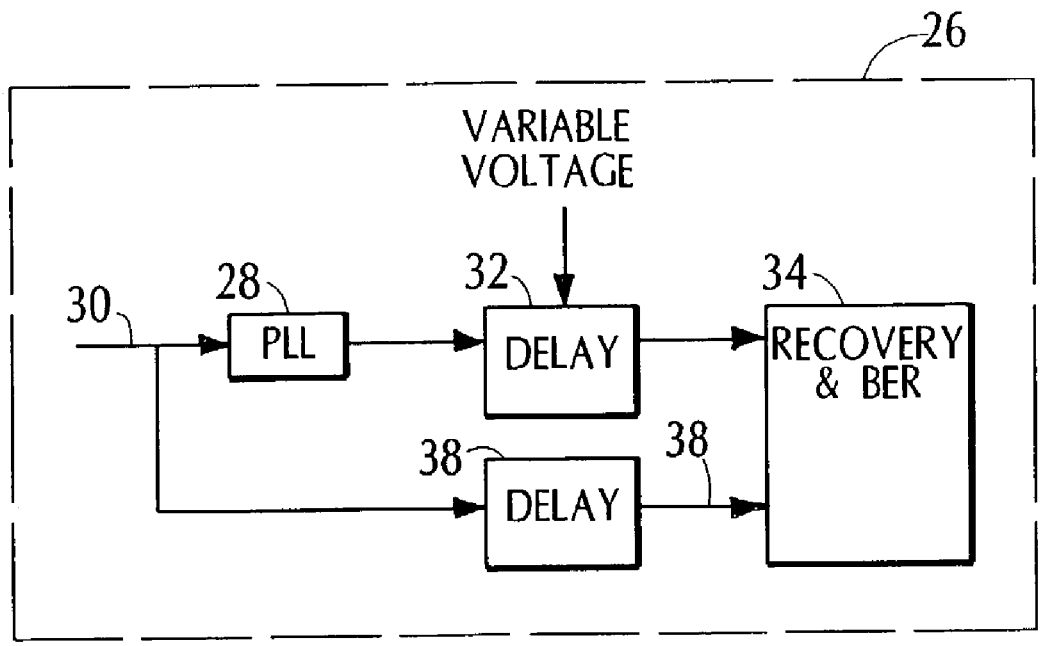
FIG. 4 is an illustration of a BIST structure for testing jitter in a phase locked loop.

FIG. 4 illustrates a BER-based BIST structure 26 for jitter in a phase-locked loop ("PLL") circuit 28. A clock signal 30 is provided to the phase-locked loop circuit 28 which, in this example, is the integrated circuit component under test. The output of the phase-locked loop circuit 28 is subject to a delay line 32. The delay line's voltage may be varied increasingly from zero and its output is fed to recovery and bit error rate circuitry 34. A reference signal derived from the clock signal 30 also is provided to the other circuitry 34. The other circuitry 34 compares the two inputs and records errors due to jitter. A clock delay line 38 with a fixed delay value can be introduced between the clock signal 30 and the circuitry 34 to make the delay between the clock edges large enough to be measured.

The different delay values of the delay line 32 may be characterized prior to any measurements using a ring oscillator circuit into which the delay line is inserted. For every step of the delay line's value variations, bit errors are counted by the recovery and BER circuitry 34 during a fixed interval of time. These counts can be used to create a graph representing the number of errors as a function of the delay between the two clocks.

FIG. 5 shows an exemplary graph 42 representing a BER. In this example the graph 42 has a 'bathtub' pattern. A The graph 42 can also be viewed as a cumulative distribution function ("CDF"), which is a function of the probability density function ("PDF") that corresponds to a histogram obtained using time interval measurements in testing for jitter.

If the jitter has a normal distribution, the standard deviation of the time interval to be measured can be computed as a difference between the times that correspond to 84% and 64% of the final CDF value. To interpret the results, a lookup table such as the one shown in FIG. 2 can be used to generate a BER curve for each delay value.

Various features of the system may be implemented in hardware, software or a combination of hardware and software. For example, some aspects of this disclosure can be implemented in computer programs executing on programmable computers. Each program can be implemented in a high level procedural or object-oriented programming language to communicate with a computer system. Furthermore, each such computer program can be stored on a storage medium, such as read only memory ("ROM") readable by a general or special purpose programmable computer, for configuring and operating the computer when the storage medium is read by the computer to perform the functions described above.

Other implementations are within the scope of the following claims.

What is claimed is:

1. A method comprising:
providing a clock signal to a circuit under test;
delaying outputs from the circuit under test by different delay values;
comparing, for each delay value, a corresponding output from the circuit under test with a reference signal derived from the clock signal to produce a bit error rate count for each delay value;
representing the bit error rate counts as a cumulative distribution function;
delaying the clock signal by a fixed amount; and
determining a jitter value in the output of the circuit under test based on the bit error rate counts.

2. The method of claim 1 including using a ring oscillator to characterize the different delay values.

3. The method of claim 1 including using a lookup table to determine the jitter value.

4. An apparatus comprising:
an integrated circuit component to provide an output in response to a clock signal, the integrated circuit component including a phase locked loop;
circuitry to delay outputs from the integrated circuit component by different delay values; and
other circuitry to compare the delayed output with a reference signal derived from the clock signal to produce a bit error rate count for each delay value and to determine a jitter value in the integrated circuit component based on the bit error rate counts, wherein the bit error rate counts are represented as a cumulative distribution function.

5. The apparatus of claim 4 including a delay line with a fixed delay value between the clock signal and the other circuitry.

6. The apparatus of claim 4 wherein the other circuitry is to use a lookup table to determine a jitter value.

* * * * *